United States Patent
Jeong et al.

(10) Patent No.: US 8,421,112 B2
(45) Date of Patent: Apr. 16, 2013

(54) LIGHT EMITTING DEVICE AND LIGHT EMITTING DEVICE PACKAGE HAVING THE SAME

(75) Inventors: Hwan Hee Jeong, Seoul (KR); Sang Youl Lee, Seoul (KR); Ji Hyung Moon, Seoul (KR); June O Song, Seoul (KR); Kwang Ki Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 163 days.

(21) Appl. No.: 12/986,592

(22) Filed: Jan. 7, 2011

(65) Prior Publication Data

US 2011/0193113 A1 Aug. 11, 2011

(30) Foreign Application Priority Data

Feb. 8, 2010 (KR) .................. 10-2010-0011703

(51) Int. Cl.
*H01L 31/0224* (2006.01)

(52) U.S. Cl.
USPC .......... 257/99; 257/91; 257/98; 257/E33.065; 257/E33.066; 438/26; 438/27

(58) Field of Classification Search .................. 257/91, 257/98, 99, E33.065, E33.066; 438/26, 27
See application file for complete search history.

(56) References Cited

U.S. PATENT DOCUMENTS

| | | | |
|---|---|---|---|
| 7,084,432 B2 | 8/2006 | Kachi | |
| 7,276,724 B2 * | 10/2007 | Sheats et al. | 257/21 |
| 7,679,097 B2 * | 3/2010 | Akaishi | 257/99 |
| 8,237,183 B2 * | 8/2012 | Yasuda et al. | 257/98 |
| 2003/0071272 A1 * | 4/2003 | Faska et al. | 257/99 |
| 2006/0043405 A1 | 3/2006 | Hata | |
| 2006/0124954 A1 * | 6/2006 | Akaishi | 257/99 |
| 2006/0151793 A1 | 7/2006 | Nagai | |
| 2007/0069196 A1 | 3/2007 | Kako et al. | |
| 2009/0039359 A1 | 2/2009 | Yoon et al. | |
| 2009/0039371 A1 | 2/2009 | Kim et al. | |
| 2009/0045425 A1 * | 2/2009 | Yasuda et al. | 257/98 |
| 2009/0045433 A1 | 2/2009 | Osawa et al. | |
| 2009/0267106 A1 | 10/2009 | Lee | |
| 2010/0163900 A1 * | 7/2010 | Seo et al. | 257/98 |
| 2010/0320488 A1 * | 12/2010 | Horie | 257/91 |
| 2011/0156070 A1 * | 6/2011 | Yoon et al. | 257/98 |
| 2012/0138969 A1 * | 6/2012 | Moon et al. | 257/88 |

FOREIGN PATENT DOCUMENTS

| | | |
|---|---|---|
| CN | 1630110 | 6/2005 |
| CN | 1819255 | 8/2006 |
| CN | 101071821 | 11/2007 |
| JP | 2007-88351 | 4/2007 |
| KR | 10-0838197 | 6/2008 |
| KR | 10-2009-0015514 | 2/2009 |

* cited by examiner

*Primary Examiner* — Allan R Wilson
(74) *Attorney, Agent, or Firm* — McKenna Long & Aldridge LLP

(57) ABSTRACT

Disclosed are a light emitting device and a light emitting device package having the same. The light emitting device includes a light emitting structure including a first conductive semiconductor layer, an active layer under the first conductive semiconductor layer, and a second conductive semiconductor layer under the active layer; a first electrode layer under the second conductive semiconductor layer; an electrode including a top surface making contact with a part of a bottom surface of the first conductive semiconductor layer; and an insulating member for covering an outer peripheral surface of the electrode, wherein a part of the insulating member extends into a region between the second conductive semiconductor layer and the first electrode layer from a bottom surface of the electrode.

21 Claims, 9 Drawing Sheets

300A

300

400

LIGHT EMITTING DEVICE AND LIGHT EMITTING DEVICE PACKAGE HAVING THE SAME

The present application claims priority under 35 U.S.C. §119(a) of Korean Patent Application No. 10-2010-0011703 filed on Feb. 8, 2010, which is hereby incorporated by reference in its entirety.

BACKGROUND

The embodiment relates to a light emitting device and a light emitting device package having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device including an electrode making contact with an inner portion of a first conductive semiconductor layer and a light emitting device package having a light emitting device.

The embodiment provides a light emitting device including a first electrode in contact with a lateral side of a first conductive semiconductor layer and an electrode layer under a second conductive semiconductor layer and a light emitting device package having a light emitting device.

An embodiment provides a light emitting device comprising, a light emitting structure including a first conductive semiconductor layer, an active layer under the first conductive semiconductor layer, and a second conductive semiconductor layer under the active layer; a first electrode layer under the second conductive semiconductor layer; an electrode including a top surface making contact with a part of a bottom surface of the first conductive semiconductor layer; a support member under the first electrode layer; and an insulating member for covering an outer peripheral surface of the electrode, wherein a part of the insulating member extends into a region between the second conductive semiconductor layer and the first electrode layer from a bottom surface of the electrode.

An embodiment provides a light emitting device comprising, a light emitting structure including a first conductive semiconductor layer, an active layer under the first conductive semiconductor layer, and a second conductive semiconductor layer under the active layer; an electrode layer under the second conductive semiconductor layer; an electrode including a top surface making contact with a part of a bottom surface of the first conductive semiconductor layer, the top surface being partially open; a support member under the electrode layer; an insulating member for insulating an outer peripheral surface of the electrode; a current diffusion layer on the first conductive semiconductor layer; and at least one first contact electrode connecting the electrode with the current diffusion layer.

An embodiment provides a light emitting device package comprising, a body; a plurality of lead electrodes on the body; a light emitting device on at least one of the lead electrodes and electrically connected to the lead electrodes; and a molding member for molding the light emitting device, wherein the light emitting device comprising: a light emitting structure including a first conductive semiconductor layer, an active layer under the first conductive semiconductor layer, and a second conductive semiconductor layer under the active layer; a first electrode layer under the second conductive semiconductor layer; an electrode including a top surface making contact with a part of a bottom surface of the first conductive semiconductor layer; and an insulating member for covering an outer peripheral surface of the electrode, wherein a part of the insulating member extends into a region between the second conductive semiconductor layer and the first electrode layer from a bottom surface of the electrode.

DETAILED DESCRIPTION OF THE EMBODIMENTS

Figure 1:
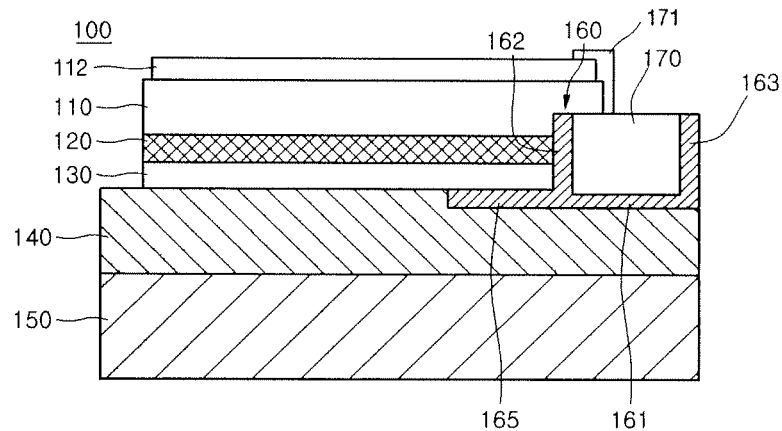
FIG. 1 is a side sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to the accompanying drawings. The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device according to the first embodiment.

Referring to FIG. 1, the light emitting device 100 according to the embodiment includes a first conductive semiconductor layer 110, an active layer 120, a second conductive semiconductor layer 130, an electrode layer 140, a conductive support member 150, an insulating member 160, a current diffusion layer 112 and an electrode 170.

The light emitting device may include an LED employing a plurality of compound semiconductor layers, such as group III-V compound semiconductor layers. The LED may emit light of blue, green or red color having a visible ray band or may emit light having an ultraviolet ray band. The light can be emitted from the LED through various semiconductors, and the embodiment may not limit the type of the semiconductors.

The light emitting device 100 includes a light emitting structure. The light emitting structure includes the first conductive semiconductor layer 110, the active layer 120 and the second conductive semiconductor layer 130. The light emitting structure includes III-V nitride semiconductors include a semiconductor material having a compositional formula of $In_xAl_yGa_{1-x-y}N$ ($0 \leqq x \leqq 1$, $0 \leqq y \leqq 1$, and $0 \leqq x+y \leqq 1$).

The first conductive semiconductor layer 110 may include a group III-V compound semiconductor doped with a first conductive dopant. For instance, the first conductive semiconductor layer 110 may include GaN, AlN, AlGaN, InGaN, InN, InAlGaN, AlInN, AlGaAs, GaP, GaAs, GaAsP or AlGaInP. If the first conductive semiconductor layer 110 is an N type semiconductor layer, the first conductive dopant is an N type dopant, such as Si, Ge, Sn, Se, or Te. The first conductive semiconductor layer 110 may have a single layer structure or a multi-layer structure, but the embodiment is not limited thereto.

The electrode 170 is provided under one side of the first conductive semiconductor layer 110. The electrode 170 may include an electrode pad or an electrode pattern including an electrode pad. The electrode pattern can be branched in the form of an arm.

The electrode 170 can be prepared as a single layer or a multiple layer by using at least one of Ti, Al, an Al alloy, In, Ta, Pd, Co, Ni, Si, Ge, Ag, an Ag alloy, Au, Hf, Pt, Ru, Au and an alloy thereof.

A roughness or a pattern can be formed on the first conductive semiconductor layer 110 to improve the light extraction efficiency. The current diffusion layer 112 is formed on the first conductive semiconductor layer 110. The current diffusion layer 112 may include a transmittive conductive layer. For instance, the current diffusion layer 112 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide). The current diffusion layer 112 can be omitted, but the embodiment is not limited thereto.

Since the electrode 170 makes contact with a lower surface of the first conductive semiconductor layer 110, the electrode 170 rarely interferes with photons travelling in the vertical direction (chip surface direction). The insulating member 160 is formed around the electrode 170 except for the top surface of the electrode 170 to prevent the electrode 170 from electrically making contact with other layers.

The insulating member 160 may include insulating material, such as $SiO_2$, $SiO_x$, $SiO_xN_y$, $Si_3N_4$ or $Al_2O_3$. The insulating member 160 includes a lower portion 161, an outer portion 162 and a support portion 165. The lower portion 161 is interposed between the electrode 170 and the electrode layer 140, the outer portion 162 covers the lateral side of the electrode 170, and the support portion 165 extends from the lower portion 161 to the interfacial surface between the second conductive semiconductor layer 130 and the electrode layer 140.

A contact electrode 171 is formed on the electrode 170. The contact electrode 171 makes contact with the electrode 170, the first conductive semiconductor layer 110 and/or the current diffusion layer 112. The electrode 170 selectively makes contact with the contact electrode 171 or the current diffusion layer 112 to diffuse current on the whole area of the light emitting device 100.

The active layer 120 is provided under the first conductive semiconductor layer 110. The active layer 120 may have a single quantum well structure, a multiple quantum well structure, a quantum wire structure, or a quantum dot structure. The active layer 120 may have a stack structure including a well layer and a barrier layer, which are made from group III-V compound semiconductor materials. For example, the active layer 120 may have a stack structure of an InGaN well layer/GaN barrier layer or an InGaN well layer/AlGaN barrier layer. A conductive clad layer may be formed on and/or under the active layer 120. The conductive clad layer may include a GaN-based semiconductor. The barrier layer may have band gap energy higher than that of the well layer, and the conductive clad layer may have band gap energy higher than that of the barrier layer.

The second conductive semiconductor layer 130 is disposed under the active layer 120. The second conductive semiconductor layer 130 includes the group III-V compound semiconductor doped with the second conductive dopant. For instance, the second conductive layer 130 may include at least one selected from the group consisting of GaN, AlN, AlGaN, InGaN, InN, InAlGaN, AlInN, AlGaAs, GaP, GaAs, GaAsP, and AlGaInP. If the second conductive semiconductor layer is a P type semiconductor layer, the second conductive dopant includes the P type dopant such as Mg or Ze. The second conductive semiconductor layer 130 can be prepared as a single layer or a multiple layer, but the embodiment is not limited thereto.

The light emitting structure may include an N type semiconductor layer, which has polarity opposite to that of the second conductive semiconductor layer, under the second conductive semiconductor layer 130. In addition, the first conductive semiconductor layer 110 can be realized as a P type semiconductor layer, and the second conductive semiconductor layer 130 can be realized as an N type semiconductor layer. Thus, the light emitting structure may include at least one of an N—P junction structure, a P—N junction structure, an N—P—N junction structure, and a P—N—P junction structure. For the purpose of convenience, the lowermost layer of the light emitting structure will be referred to as the second conductive semiconductor layer.

The electrode layer 140 is formed under the second conductive semiconductor layer 120. The electrode layer 140 may include at least one of an ohmic layer, a reflective layer and a bonding layer. The electrode layer 140 may have a layer structure or a pattern structure under the second conductive semiconductor layer 120 for the purpose of ohmic contact. The ohmic contact can be achieved by using reflective metal or conductive oxide. The electrode layer can be prepared as a single layer or a multiple layer by using at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

In addition, the electrode layer 140 can be formed by using one selected from the group consisting of Ag, Ni, Al, Rh, Pd, Ir, Ru, Mg, Zn, Pt, Au, Hf and combination thereof. The electrode layer 140 can be formed as a multiple layer by using the above metallic material and transmittive conductive material, such as IZO, IZTO, IAZO, IGZO, IGTO, AZO or ATO. For instance, the electrode layer 140 may have a stack structure of IZO/Ni, AZO/Ag, IZO/Ag/Ni or AZO/Ag/Ni. The electrode layer 140 may include a bonding layer, such as a barrier metal layer or a bonding metal layer. For instance, the electrode layer 140 may include at least one of Ti, Au, Sn, Ni, Cr, Ga, In, Bi, Cu, Ag and Ta.

The conductive support member 150 is formed under the electrode layer 140. The conductive support member 150 is a base substrate having a predetermined thickness and includes Cu, Au, Ni, Mo, Cu—W, or a carrier wafer, such as Si, Ge, GaAs, ZnO, SiC, SiGe, Ga2O3 or GaN. The conductive support member 150 can be omitted or can be prepared as a single layer by integrating two layers depending on the thickness or strength of the conductive support member 150. In addition, the conductive support member 150 may be prepared as a conductive sheet.

According to the embodiment, the electrode 170 is positioned under one side of a device to supply power having a first polarity and the electrode layer 140 is disposed under the device to supply power having a second polarity, thereby improving light extraction efficiency on the top surface of the first conductive semiconductor layer 110.

FIGS. 2 to 7 are sectional views showing the procedure for manufacturing the light emitting device according to the first embodiment.

Figure 2:
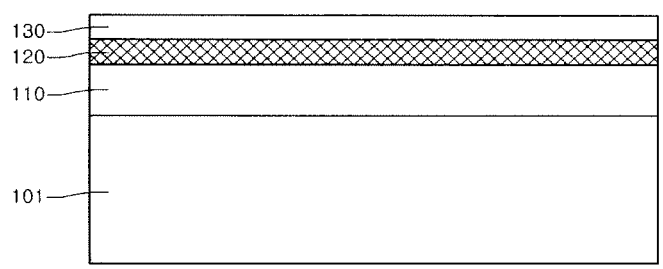
FIGS. 2 to 7 are sectional views showing the procedure for manufacturing a light emitting device according to the embodiment.

Referring to FIG. 2, a substrate 101 is loaded into growth equipment and a group II to VI compound semiconductor is formed on the substrate 101 in the form of a layer or a pattern.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

The substrate 101 may include one selected from the group consisting of Al$_2$O$_3$, GaN, SiC, ZnO, Si, GaP, InP, Ga$_2$O$_3$, conductive material and GaAs. A concave-convex structure can be formed on the top surface of the substrate 101. In addition, a layer or a pattern including a group II to VI compound semiconductor can be formed on the substrate 101. For instance, at least one of a ZnO layer (not shown), a buffer layer (not shown) and an undoped semiconductor layer (not shown) can be formed on the substrate 101. The buffer layer or the undoped semiconductor layer can be formed by using the group III-V compound semiconductor. The buffer layer may reduce the lattice constant difference relative to the substrate, and the undoped semiconductor layer may include an undoped GaN-based semiconductor.

The first conductive semiconductor layer 110 is formed on the substrate 101, the active layer 120 is formed on the first conductive semiconductor layer 110, and the second conductive semiconductor layer 130 is formed on the active layer 120. Other layers may be present on/under the above layers, but the embodiment is not limited thereto.

The first conductive semiconductor layer 110 may include a group III-V compound semiconductor doped with a first conductive dopant. For instance, the first conductive semiconductor layer 110 may include one selected from the group consisting of GaN, AlN, AlGaN, InGaN, InN, InAlGaN, AlInN, AlGaAs, GaP, GaAs, GaAsP and AlGaInP. If the first conductive semiconductor layer 110 is an N type semiconductor layer, the first conductive dopant is an N type dopant, such as Si, Ge, Sn, Se, or Te. The first conductive semiconductor layer 110 may have a single layer structure or a multi-layer structure, but the embodiment is not limited thereto.

The active layer 120 is disposed on the first conductive semiconductor layer 110. The active layer 120 may have a single quantum well structure or a multiple quantum well structure. The active layer 120 may have a stack structure including a well layer and a barrier layer, which are made from group III-V compound semiconductor materials. For example, the active layer 120 may have a stack structure of an InGaN well layer/GaN barrier layer or an InGaN well layer/AlGaN barrier layer.

A conductive clad layer may be formed on and/or under the active layer 120. The conductive clad layer may include a GaN-based semiconductor.

The second conductive semiconductor layer 130 is formed on the active layer 120. The second conductive semiconductor layer 130 includes the group III-V compound semiconductor doped with the second conductive dopant. For instance, the second conductive layer 130 may include at least one selected from the group consisting of GaN, AlN, AlGaN, InGaN, InN, InAlGaN, AlInN, AlGaAs, GaP, GaAs, GaAsP, and AlGaInP. If the second conductive semiconductor layer is a P type semiconductor layer, the second conductive dopant includes the P type dopant such as Mg or Ze. The second conductive semiconductor layer 130 can be prepared as a single layer or a multiple layer, but the embodiment is not limited thereto.

The first conductive semiconductor layer 110, the active layer 120 and the second conductive semiconductor layer 130 may constitute the light emitting structure. A third conductive semiconductor layer, that is, an N type semiconductor layer or a P type semiconductor layer can be formed on the second conductive semiconductor layer 130. Thus, the light emitting structure may include at least one of an N—P junction structure, a P—N junction structure, an N—P—N junction structure, and a P—N—P junction structure. In the following description, the uppermost layer of the light emitting structure will be referred to as the second conductive semiconductor layer 130.

Figure 3:
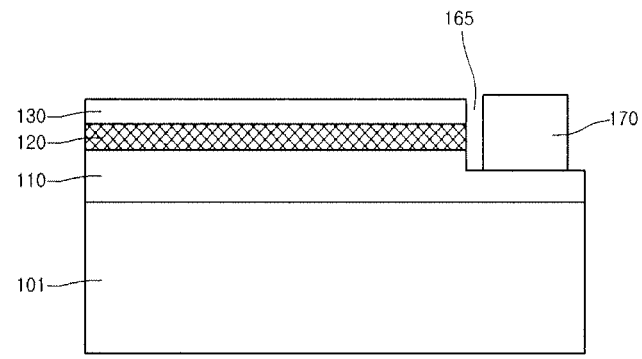

Referring to FIG. 3, the electrode 170 is formed at one side of the first conductive semiconductor layer 110. After forming a mask pattern on the top surface of the second conductive semiconductor layer 130 except for the etching area, a part of the second conductive semiconductor layer 130 is etched to expose one side of the first conductive semiconductor layer 110. Then, the electrode 170 is formed at one side of the exposed first conductive semiconductor layer 110.

The electrode 170 is spaced apart from lateral sides of the second conductive semiconductor layer 130, the active layer 120, and the first conductive semiconductor layer 110 by a predetermined gap 165. The electrode 170 can be formed after forming the mask pattern or the insulating member on the region except for the region where the electrode 170 will be formed later.

The electrode 170 may include an electrode pad having a predetermined shape and an arm-shaped electrode pattern, or can be connected to the electrode pad.

The electrode 170 can be prepared as a single layer or a multiple layer by using at least one of Ti, Al, an Al alloy, In, Ta, Pd, Co, Ni, Si, Ge, Ag, an Ag alloy, Au, Hf, Pt, Ru, Au and an alloy thereof.

Figure 4:
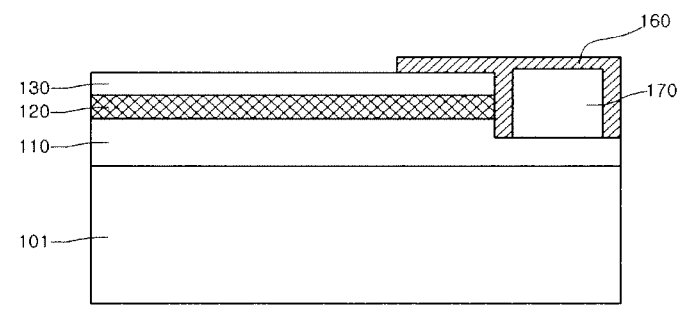

Referring to FIG. 4, the insulating member 160 is formed around the electrode 170. The insulating member 160 may partially extend along the top surface of the second conductive semiconductor layer 130 while surrounding the lateral sides and the top surface of the electrode 170.

Figure 5:
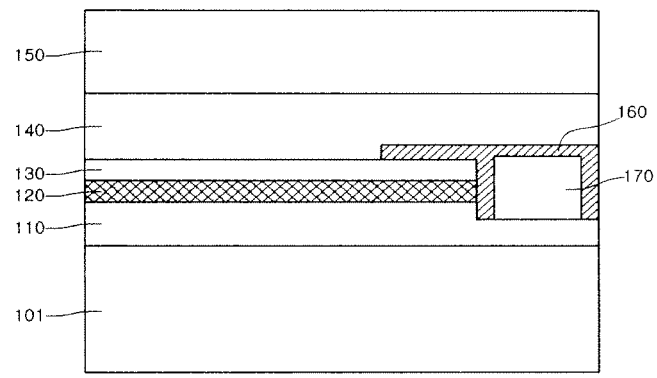

Referring to FIG. 5, the electrode layer 140 is formed on the second conductive semiconductor layer 130 and the insulating member 160, and the conductive support member 150 is formed on the electrode layer 140.

The electrode layer 140 may include at least one of an ohmic layer, a reflective layer and a bonding layer. The ohmic layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Al, Ag, Pd, Rh, or Pt. The reflective layer may include one selected from the group consisting of Ag, Ni, Al, Rh, Pd, Ir, Ru, Mg, Zn, Pt, Au, Hf or combination thereof. In addition, the reflective layer can be prepared as a multiple structure by using the above metallic materials and transmittive conductive material, such as IZO, IZTO, IAZO, IGZO, IGTO, AZO, or ATO. For instance, the reflective layer may have a stack structure including IZO/Ni, AZO/Ag, IZO/Ag/Ni, or AZO/Ag/Ni. The bonding layer is provided to improve adhesive property of the conductive support member 150. The bonding layer may include at least one of Ti, Au, Sn, Ni, Cr, Ga, In, Bi, Cu, Ag and Ta.

The electrode layer 140 may have a stack structure including the ohmic layer/reflective layer/bonding layer, or the reflective layer (including the ohmic layer)/bonding layer, but the embodiment is not limited thereto.

The conductive support member 150 is formed on the electrode layer 140. The conductive support member 150 is a base substrate including Cu, Au, Ni, Mo, Cu—W, or a carrier wafer, such as Si, Ge, GaAs, ZnO, SiC, SiGe, $Ga_2O_3$ or GaN. The conductive support member 150 can be omitted or can be prepared as a single layer by integrating two layers. In addition, the conductive support member 150 may be prepared as a conductive sheet.

Figure 6:
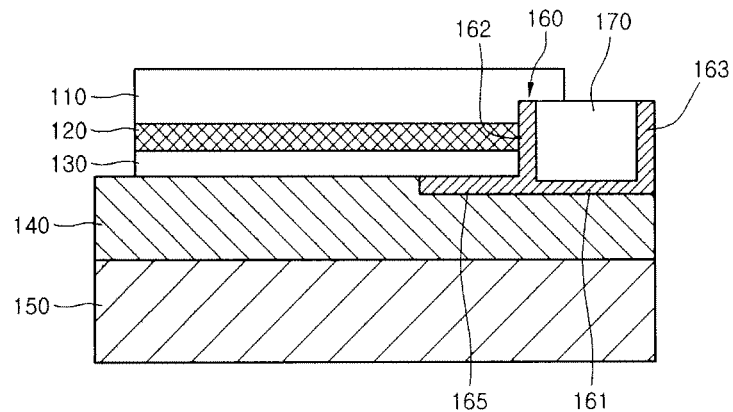

Referring to FIGS. 5 and 6, after the conductive support member 150 has been positioned on the base, the substrate 101 is removed through a physical/chemical scheme. That is, if a laser beam having a predetermined wavelength band is irradiated onto the substrate 101, thermal energy is concentrated onto the boundary between the substrate 101 and the first conductive semiconductor layer 110, so that the substrate 101 is separated from the first conductive semiconductor layer 110. When another semiconductor layer is interposed between the substrate 101 and the first conductive semiconductor layer 110, the substrate 101 can be separated from another semiconductor layer, but the embodiment is not limited thereto. After the substrate 101 has been removed, an additional process, such as an inductively coupled plasma/ reactive ion etching (ICP/RIE) process, can be performed with respect to the surface of the first conductive semiconductor layer 110.

Figure 7:
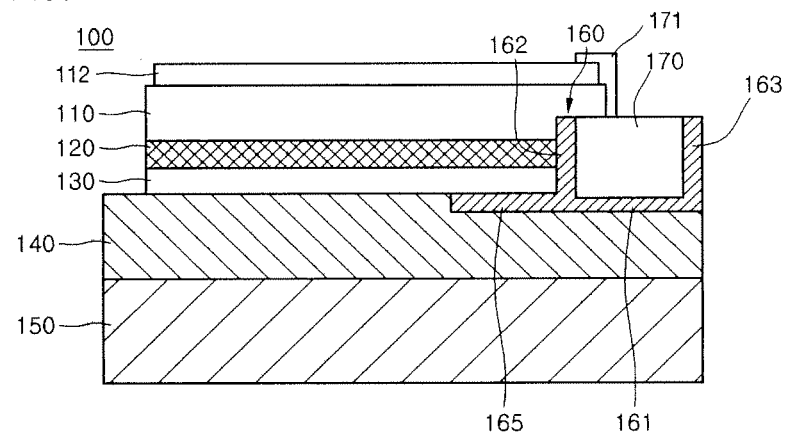

Referring to FIGS. 6 and 7, the chip channel area and the electrode area are etched. When the chip channel area is etched, a boundary area of the chip is etched until the top surface of the electrode layer 140 is exposed.

In addition, a portion of the first conductive semiconductor layer 110, that is, the electrode area is etched to expose the electrode 170. That is, the first conductive semiconductor layer 110 is partially etched to expose the top surface of the electrode 170.

A step structure is formed at one side of the first conductive semiconductor layer 110, and the top surface of the electrode 170 partially makes contact with the bottom surface of the first conductive semiconductor layer 110.

A roughness or a pattern can be formed on the first conductive semiconductor layer 110 to improve the light extraction efficiency.

The electrode 170 is electrically insulated from other layers by the insulating member 160 positioned around the electrode 170. The insulating member 160 may include insulating material, such as $SiO_2$, $SiO_x$, $SiO_xN_y$, $Si_3N_4$, or $Al_2O_3$.

The insulating member 160 includes the lower portion 161, the outer portion 162 and the support portion 165. The lower portion 161 is interposed between the electrode 170 and the electrode layer 140, the outer portion 162 covers the lateral side of the electrode 170, and the support portion 165 extends from the lower portion 161 to the interfacial surface between the second conductive semiconductor layer 130 and the electrode layer 140.

The current diffusion layer 112 is formed on the first conductive semiconductor layer 110. The current diffusion layer 112 may include a transmittive conductive layer. For instance, the current diffusion layer 112 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide). The current diffusion layer 112 can be omitted, but the embodiment is not limited thereto.

Since the electrode 170 is disposed under one side of the first conductive semiconductor layer 110, other than the top surface of the first conductive semiconductor layer 110, the electrode 170 rarely interferes with photons travelling in the vertical direction (chip surface direction). The insulating member 160 is formed around the electrode 170 except for the top surface of the electrode 170 to electrically insulate the electrode 170 from other layers.

The contact electrode 171 is formed on the electrode 170. The contact electrode 171 makes contact with the electrode 170, the first conductive semiconductor layer 110 and/or the current diffusion layer 112. Due to the connection structure among the electrode 170, the contact electrode 171 and the current diffusion layer 112, current can be widely diffused.

Figure 8:
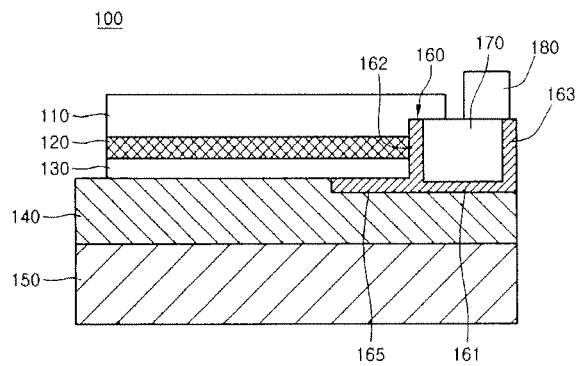
FIG. 8 is a sectional view showing a light emitting device modified from a light emitting device shown in FIG. 1.

FIG. 8 is a sectional view showing a light emitting device modified from the light emitting device shown in FIG. 1. The same reference numerals will be assigned to the same elements and description about the elements and structures that have already been explained with reference to FIG. 1 will be omitted in order to avoid redundancy.

Referring to FIG. 8, an electrode pad 180 is formed on the electrode 170. The size, position and shape of the electrode pad 180 may vary depending on the area of the electrode 170 and the embodiment is not limited thereto. The electrode pad 180 is made from material identical to that of the electrode 170, or Au can be added to the electrode pad 180 for the purpose of bonding connection.

The electrode 170 partially makes contact with the first conductive semiconductor layer 110. At this time, the contact size is approximate to the width of the first conductive semiconductor layer 110. The electrode 170 may have an arm structure, but the embodiment is not limited thereto.

Figure 9:
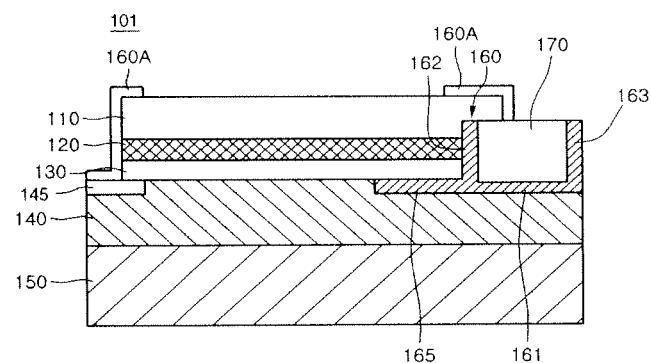
FIG. 9 is a sectional view showing a light emitting device according to the second embodiment.

FIG. 9 is a sectional view showing a light emitting device according to the second embodiment. The same reference numerals will be assigned to the same elements and description about the elements and structures that have already been explained in the first embodiment will be omitted in order to avoid redundancy.

Referring to FIG. 9, the light emitting device 100 is provided at an outer peripheral portion thereof with a channel layer 145 and an insulating layer 160A. The channel layer 145 can be applied to the first embodiment or other embodiments without limitation.

The channel layer 145 is provided between the second conductive semiconductor layer 130 and the electrode layer 140 along the outer peripheral portion of the light emitting device 100. The channel layer 145 is a continuous pattern having the shape of a strip, a ring, a frame or a loop. In addition, the channel layer 145 may have a predetermined width (for example, 2 μm or less) and can be prepared as a single layer or a multiple layer by using the same material or different materials.

The channel layer 145 may include transmittive material, such as oxide, nitride or insulating material. For instance, the channel layer 145 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

The channel layer 145 can prevent the short circuit even if the outer wall of the light emitting structure is exposed to moisture, thereby enabling the LED to have superior property under the high moisture condition. When the laser scribing process is performed, the laser beam passes through the channel layer 145 so that metallic particles caused by the laser beam may not be generated, thereby preventing interlayer short circuit from occurring at the sidewall of the light emitting structure.

The sidewalls of the light emitting structure 110, 120 and 130 are spaced apart from the electrode layer 140 by the channel layer 145.

After the light emitting structure 110, 120 and 130 have been formed, the channel layer 145 having a predetermined width is formed on the channel area (or a chip boundary area) of an individual chip. Thus, when the channel area is etched, the top surface of the channel layer 145 is exposed to the outside.

The channel layer 145 can prevent the moisture intrusion at the sidewall and improve the electric reliability at the sidewall of the chip. In addition, the channel layer 145 can improve the light extraction efficiency by varying the critical angle of the light incident into the channel layer 145.

An inner portion of the channel layer 145 is disposed between the second conductive semiconductor layer 130 and the electrode layer 140 and an outer portion of the channel layer 145 is disposed on the top surface of the outer peripheral portion of the electrode layer 140 such that the outer portion of the channel layer 145 can be open or make contact with the bottom surface of the insulating layer 160A.

An additional electrode pad may protrude from the top surface of the electrode 170, but the embodiment is not limited thereto.

Figure 10:
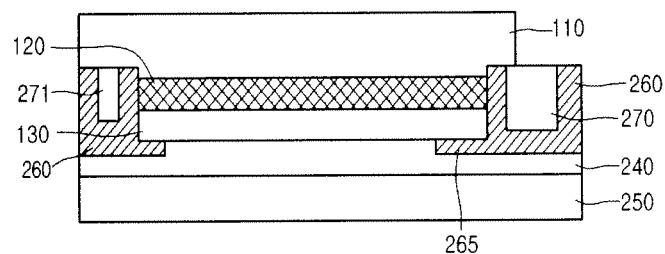
FIGS. 10 and 11 are views showing a light emitting device according to the third embodiment.
Figure 11:
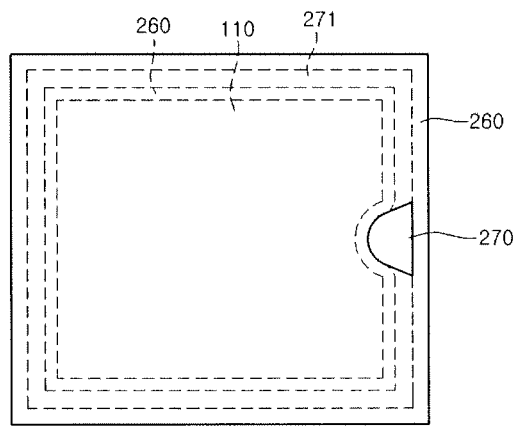

FIGS. 10 and 11 are views showing a light emitting device according to the third embodiment. The same reference numerals will be assigned to the same elements and description about the elements and structures that have already been explained in the first embodiment will be omitted in order to avoid redundancy.

Referring to FIG. 10, the light emitting device 200 includes an electrode 270, a contact electrode 271 and an insulating member 270 that selectively insulates the electrode 270. The electrode 270, the contact electrode 271 and the insulating member 260 make contact with the bottom surface of the first conductive semiconductor layer 110.

The electrode 270 includes the contact electrode 271, which is disposed in the first conductive semiconductor layer 110 while making contact with an inner portion of the first conductive semiconductor layer 110. When viewed from the top of the chip, the contact electrode 271 is not exposed out of the first conductive semiconductor layer 110, that is, the contact electrode 271 is not exposed to the outside.

The contact electrode 271 is insulated from other layers by the insulating member 260. The electrode 270 is connected with the contact electrode 271 in the form of a ring, a loop, a frame, an open loop, or a closed loop. The electrode 270 and the contact electrode 271 can uniformly supply power to the outer side of the first conductive semiconductor layer 110 so that current supply efficiency can be improved.

In addition, since the contact electrode 271 of the electrode 270 is not exposed to the top side of the chip, the size of the top surface of the first conductive semiconductor layer 110 may not be reduced, so that the light extraction area may not be reduced.

An inner support portion 265 of the insulating member 260 extends to the interfacial surface between the second conductive semiconductor layer 130 and the electrode layer 240. Since the inner support portion 265 includes insulating material, the inner support portion 265 can prevent current supplied through the electrode layer 240 from flowing through the shortest path, so that the inner support portion 265 can perform the current blocking or current diffusion function. In addition, the inner support portion 265 can be prepared in the form of a pattern, but the embodiment is not limited thereto.

A roughness (or a pattern) and/or a transparent electrode layer can be formed on the top surface of the first conductive semiconductor layer 110 without limitation. In addition, the structure disclosed in the first embodiment can be selectively adopted on the first conductive semiconductor layer 110.

Figure 12:
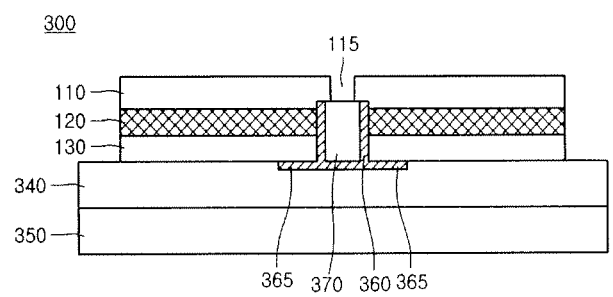
FIG. 12 is a side sectional view showing a light emitting device according to the fourth embodiment.

FIG. 12 is a side sectional view showing a light emitting device according to the fourth embodiment. The same reference numerals will be assigned to the same elements and description about the elements and structures that have already been explained in the first embodiment will be omitted in order to avoid redundancy.

Referring to FIG. 12, the light emitting device 300 includes an electrode 370 disposed at the chip center area. The center area of the first conductive semiconductor layer 110 is formed with an opening 115. The opening 115 serves as an area for electric contact of a pattern or a wire bonding.

The top surface of the electrode 370 is exposed through the opening 115. The electrode 370 makes contact with an inner bottom surface of the first conductive semiconductor layer 110 and transmits the current at the center area of the first conductive semiconductor layer 110. In addition, the electrode 370 can be directly or indirectly connected to the contact electrode and/or a current diffusion layer, such as a transparent electrode layer.

The insulating layer 360 is disposed around the electrode 370. The inner support portion 365 provided at an outer peripheral portion of the electrode 370 extends to the interfacial surface between the second conductive semiconductor layer 130 and the electrode layer 340 so as to prevent current supplied through the electrode layer 340 from flowing through the shortest path, so that the inner support portion 365 can perform the current blocking or current diffusion function. In addition, the inner support portion 265 can be prepared in the form of a pattern, but the embodiment is not limited thereto.

Figure 13:
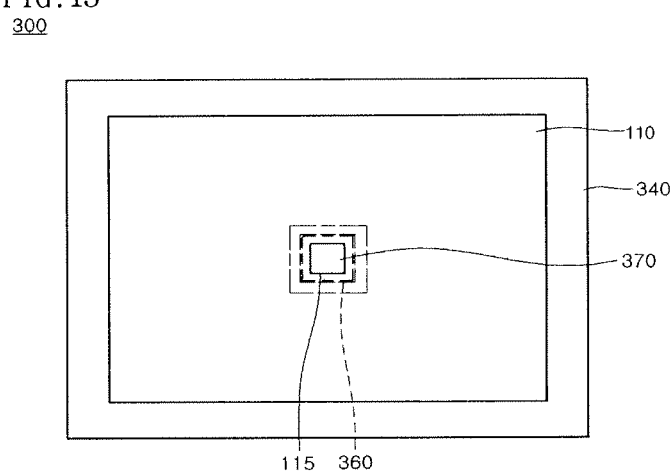
FIG. 13 is a plan view of FIG. 12.

FIG. 13 is a plan view of FIG. 12. Referring to FIG. 13, the electrode 370 is exposed through the opening 115 formed at the center of the first conductive semiconductor layer 110.

Figure 14:
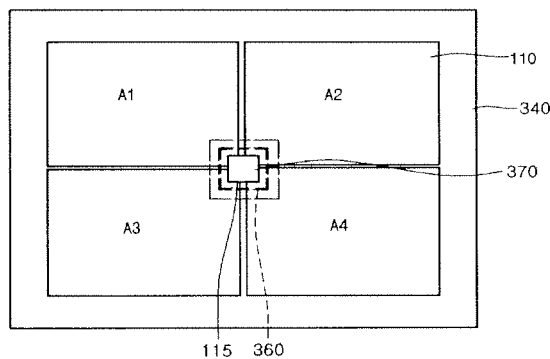
FIG. 14 is a plan view modified from FIG. 13.

FIG. 14 is a plan view showing a light emitting device 300A modified from FIG. 13.

Referring to FIG. 14, the light emitting device 300A includes a light emitting structure having a plurality of cells (for instance, at least two cells). According to the embodiment, four cells A1, A2, A3 and A4 are provided. The cells A1, A2, A3 and A4 can supply power through the electrode 370 formed at the center thereof. The cells A1, A2, A3 and A4 are insulated from each other by the insulating member 360 and exposed to the outside through the opening 115.

The electrode 370 may electrically make contact with the contact electrode or the current diffusion layer, but the embodiment is not limited thereto.

An insulating layer (not shown) can be formed among the cells A1, A2, A3 and A4 to insulate adjacent cells from each other. The contact electrode connected to the electrode 370 is formed on the insulating layer disposed between the adjacent cells to effectively supply power.

Figure 15:
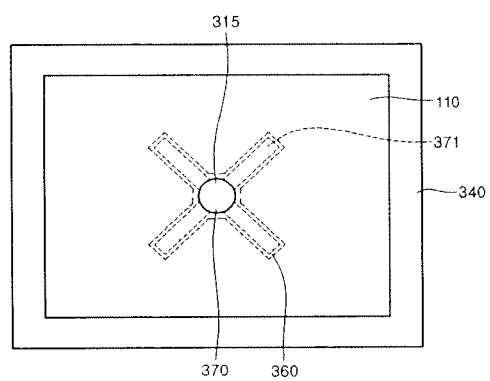
FIG. 15 is a plan view modified from FIG. 13.

FIG. 15 shows a light emitting device modified from FIG. 13. Referring to FIG. 15, the contact electrode 371 is connected to the electrode 370. The contact electrode 371 may have various shapes, such as a radial pattern, a cross pattern, a line pattern having at least one line, or a curved pattern. The contact electrode 371 is not exposed to the top surface of the first conductive semiconductor layer 110. The electrode 370 and the contact electrode 371 are insulated by the insulating member 370.

Figure 16:
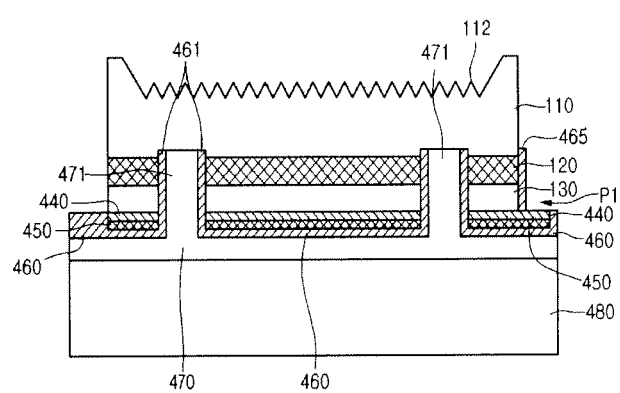
FIG. 16 is a side sectional view showing a light emitting device according to the fifth embodiment.

FIG. 16 is a sectional view showing a light emitting device according to the fifth embodiment. The same reference numerals will be assigned to the same elements and description about the elements and structures that have already been explained in the previous embodiments will be omitted in order to avoid redundancy.

Referring to FIG. 16, the light emitting device 400 includes a first conductive semiconductor layer 110, an active layer 120, a second conductive semiconductor layer 130, an ohmic layer 440, a reflective layer 450, an electrode layer 470, a conductive support member 480, and an insulating member 460. The ohmic layer 440 and the reflective layer 450 can be defined as a second electrode layer electrically connected to the second conductive semiconductor layer 130, and the electrode layer 470 can be defined as a first electrode layer electrically connected to the first conductive semiconductor layer 110.

The first conductive semiconductor layer 110 is positioned at the top of the chip and a roughness or a pattern 112 can be formed on the first conductive semiconductor layer 110.

The active layer 120 is formed under the first conductive semiconductor layer 110 and the second conductive semiconductor layer 130 is formed under the active layer 120. The light emitting structure including the first conductive semiconductor layer 110, the active layer 120 and the second conductive semiconductor layer 130 is identical to that of the first embodiment.

The ohmic layer 440 is formed under the second conductive semiconductor layer 130, and the reflective layer 450 is formed under the ohmic layer 440. The insulating member 460 is formed under the reflective layer 450, and the conductive support member 480 is formed under the electrode layer 470.

The ohmic layer 440 makes contact with the bottom surface of the second conductive semiconductor layer 130. The ohmic layer 440 can be prepared in the form of a layer or a plurality of patterns. The ohmic layer 440 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Al, Ag, Pd, Rh, and Pt.

The electrode layer 470 can be prepared as a single layer or a multiple layer by using reflective electrode material having ohmic characteristics. For instance, the electrode layer 470 may include at least one of Ag, Ni, Al, Rh, Pd, Ir, Ru, Mg, Zn, Pt, Au, Hf, combination thereof, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO, but the embodiment is not limited thereto. If the electrode layer 470 serves as an ohmic, the ohmic layer can be omitted.

An area P1 of the ohmic layer 440 and/or the reflective layer 450 is open and an electrode pad (not shown) or an electrode (not shown) can be formed through the open area P1. The electrode pad is bonded with a wire (not shown). In addition, an insulating layer 465 is disposed at an inner portion of an area where the electrode pad or the electrode is formed in order to prevent electric short.

The reflective layer 450 makes contact with the bottom surface of the ohmic layer 440 and includes reflective material having reflectivity of 50% or above. For instance, the reflective layer 450 can be formed by using one selected from the group consisting of Ag, Ni, Al, Rh, Pd, Ir, Ru, Mg, Zn, Pt, Au, Hf and combination thereof. The reflective layer 450 can be formed as a multiple layer by using the above metallic material and transmittive conductive material, such as IZO, IZTO, IAZO, IGZO, IGTO, AZO or ATO. For instance, the reflective layer 450 may have a stack structure of IZO/Ni, AZO/Ag, IZO/Ag/Ni or AZO/Ag/Ni. If the reflective layer 450 is subject to the ohmic contact, the ohmic layer 440 can be omitted, but the embodiment is not limited thereto.

The insulating member 460 insulates the electrode layer 470 from other layers. For instance, the insulating member 460 insulates the electrode layer 470 from the reflective layer 450, the ohmic layer 440, the second conductive semiconductor layer 130 and the active layer 120.

The contact electrode 471 of the electrode layer 470 is vertically protruded upward to make contact with the inner bottom surface of the first conductive semiconductor layer 110. That is, the contact electrode 471 of the electrode layer 470 electrically makes contact with the first conductive semiconductor layer 110. The outer portion 461 of the insulating member 460 is formed around the electrode layer 470 except for the top surface of the contact electrode 471 of the electrode layer to prevent the electric short of the electrode layer 470 with respect to other layers.

The electrode 470 may have a plurality of contact electrodes 471 which are spaced apart from each other. In this case, the current supply can be facilitated.

An outer portion of the insulating member 460 extends outward beyond the light emitting structure 110, 120 and 130 to prevent the interlayer short from occurring at the sidewall of light emitting structure.

The electrode layer 470 may include one selected from the group consisting of Ag, Ni, Al, Rh, Pd, Ir, Ru, Mg, Zn, Pt, Au, and combination thereof. The electrode layer 470 can be prepared as a multiple layer using the above materials or other metallic materials by taking an ohmic contact into consideration.

The conductive support member 480 is formed under the electrode layer 470. The conductive support member 480 is a base substrate and includes Cu, Au, Ni, Mo, Cu—W, a carrier wafer such as Si, Ge, GaAs, ZnO, SiC, SiGe, $Ga_2O_3$ or GaN, or a conductive sheet.

A bonding layer (not shown) is provided between the electrode layer 470 and the conductive support member 480 to improve adhesive property of the conductive support member 480. The bonding layer may include at least one of Ti, Au, Sn, Ni, Cr, Ga, In, Bi, Cu, Ag and Ta.

According to the fifth embodiment, the electrode pad is disposed at one side of the chip to supply power having a first polarity and power having a second polarity is supplied through the whole area of the bottom of the chip. Thus, non-transparent metal can be omitted from the top surface of the chip so that the light extraction efficiency can be improved.

Figure 17:
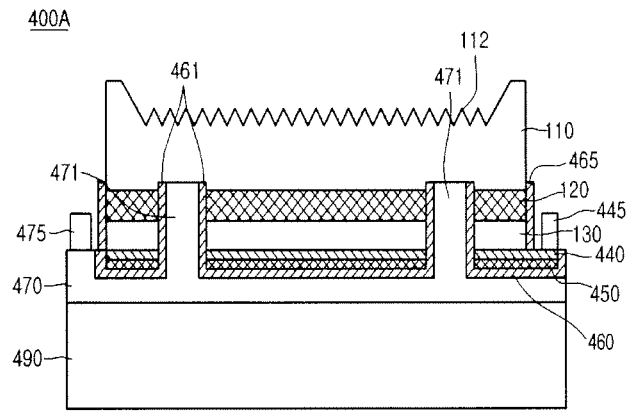
FIG. 17 is a side sectional view showing a light emitting device according to the sixth embodiment.

FIG. 17 is a side sectional view showing a light emitting device according to the sixth embodiment. The same reference numerals will be assigned to the same elements and description about the elements and structures that have already been explained in the fifth embodiment will be omitted in order to avoid redundancy.

Referring to FIG. 17, the light emitting device 400A includes a first conductive semiconductor layer 110, the active layer 120, the second conductive semiconductor layer 1310, the ohmic layer 440, the reflective layer 450, the electrode layer 470, an insulating substrate 490, a first electrode pad 475, a second electrode pad 445 and the insulating member 460.

One side of the electrode layer 470 is exposed to the outside and the first electrode pad 475 is formed on one side of the electrode layer 470. A plurality of first electrode pad 475 can be provided while being spaced apart from each other.

The second electrode pad 445 is formed on the exposed portion of the ohmic layer 440 and/or the reflective layer 450. A plurality of exposed portions can be provided such that a plurality of second electrode pads 455 can be provided on the exposed portions.

The insulating layer 465 is formed around the light emitting structure to prevent the interlayer short of the light emitting structure.

The insulating substrate 490 is disposed under the electrode layer 470. The insulating substrate 490 may include sapphire, but the embodiment is not limited thereto.

According to the sixth embodiment, the second electrode pad is provided at the outer portion of the chip so that the wire can be easily connected. In addition, since the size of the top surface of the first conductive semiconductor layer is not reduced, the light extraction efficiency can be improved. Further, power having the first polarity and the second polarity can be supplied through the bottom of the chip so that the light emitting device may have an improved current path.

Figure 18:
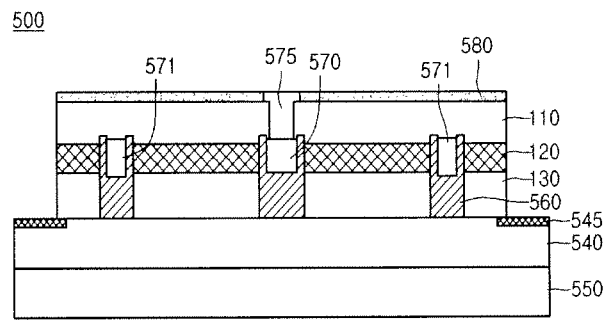
FIG. 18 is a side sectional view showing a light emitting device according to the seventh embodiment.

FIG. 18 is a side sectional view showing a light emitting device according to the seventh embodiment. The same reference numerals will be assigned to the same elements and description about the elements and structures that have already been explained in the previous embodiments will be omitted in order to avoid redundancy.

Referring to FIG. 18, the light emitting device 500 includes the first conductive semiconductor layer 110, the active layer, the second conductive semiconductor layer 130, an electrode layer 540, a channel layer 545, a conductive support member 550, an electrode 570, a current diffusion layer 580, and an insulating member 560.

The channel layer 545 is disposed at an outer peripheral portion of the electrode layer 540. The channel layer 545 is provided between the second conductive semiconductor layer 130 and the electrode layer 540 along the outer peripheral portion of the light emitting device. The channel layer 545 is a continuous pattern including the shape of a link, a ring, a loop or a frame. In addition, the channel layer 545 may have a predetermined width (for example, 2 μm or less).

The channel layer 545 may include transmittive material, such as oxide, nitride or insulating material. For instance, the channel layer 545 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$. The channel layer 545 is made from material, which is identical to or different from that of the insulating member 560. If the channel layer 545 includes the material identical to that of the insulating member 560, the channel layer 545 and the insulating member 560 can be formed through the same process.

The insulating member 560 is formed on a plurality of regions between the electrode layer 540 and the first conductive semiconductor layer 110. At least one electrode 570 and the contact electrode 571 branching from the electrode 571 are formed at the inner upper portion of the insulating member 560. The electrode 570 and the contact electrode 571 make contact with the inner bottom surface of the first conductive semiconductor layer 110.

The electrode pad 575 is formed on the electrode 570 and exposed to the top side of the chip. The electrode pad 575 can make contact with the first conductive semiconductor layer 110 and electrically make contact with the current diffusion layer 580. The current diffusion layer 580 is formed on the surface of the first conductive semiconductor layer 110 to widely diffuse the current.

The current diffusion layer 580 may include a transparent conductive layer or a contact electrode made from electrode material, but the embodiment is not limited thereto.

A low-refractive layer, instead of the current diffusion layer 580, can be formed on the first conductive semiconductor layer 110. For instance, the low-refractive layer may include oxide-base material having the refractive index lower than that of the nitride semiconductor. The low-refractive layer may include one selected from the group consisting of $SiO_2$, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide).

Figure 19:
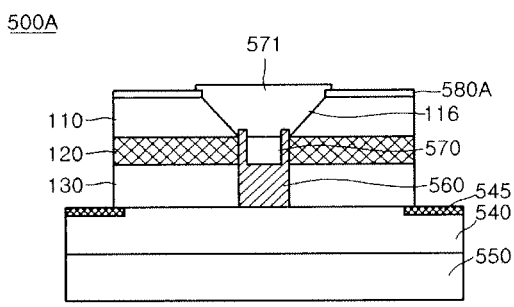
FIG. 19 is a side sectional view showing a light emitting device according to the eighth embodiment.

FIG. 19 is a side sectional view showing a light emitting device according to the eighth embodiment. The same reference numerals will be assigned to the same elements and description about the elements and structures that have already been explained in the seventh embodiment will be omitted in order to avoid redundancy.

Referring to FIG. 19, the light emitting device 500A includes the insulating member 560 provided in the light emitting structure 110, 120 and 130. The electrode 570 is provided at the inner upper portion of the insulating member 560 and the electrode pad 571 connected to the first conductive semiconductor layer 110 through via connection is formed on the electrode 570. An outer portion of the electrode pad 571 extends onto a current diffusion layer 580A.

The upper diameter of the electrode pad 571 is larger than the lower diameter of the electrode pad 571. That is, the electrode pad 571 has a reverse-conical shape or a polygonal shape, but the embodiment is not limited thereto.

Figure 20:
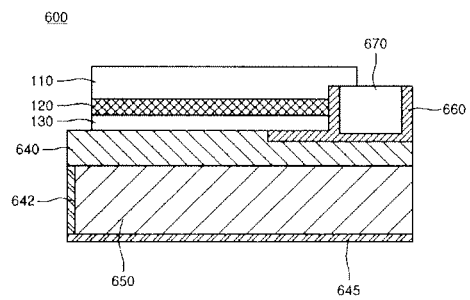
FIG. 20 is a side sectional view showing a light emitting device according to the ninth embodiment.

FIG. 20 is a side sectional view showing a light emitting device according to the ninth embodiment. The same reference numerals will be assigned to the same elements and description about the elements and structures that have already been explained in the first embodiment will be omitted in order to avoid redundancy.

Referring to FIG. 20, the light emitting device 600 includes an electrode layer 640 formed under the second conductive semiconductor layer 130, an insulating substrate 650 formed under the electrode layer 640, a connection electrode 642 formed at one side of the insulating substrate 650 and a bottom electrode 645 formed on the bottom surface of the insulating substrate 650.

The electrode layer 640 is connected to the bottom electrode 645, which is formed on the bottom surface of the insulating substrate 650, through the connection electrode 642. The connection electrode 642 is formed at one side or both sides of the insulating substrate 650 in order to connect the electrode layer 640 to the bottom electrode 645.

The insulating member 660 is disposed between the electrode layer 640 and one side of the second conductive semiconductor layer 130 and an electrode 670 is disposed at an inner upper portion of the insulating member 660. The structure of the electrode 670 and the insulating member 660 is similar to that of the first embodiment.

Figure 21:
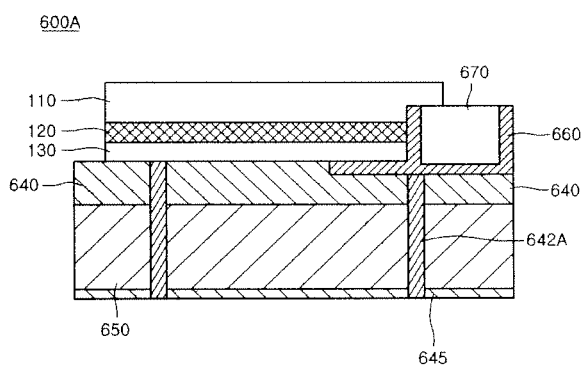
FIG. 21 is a side sectional view showing a light emitting device according to the tenth embodiment.

FIG. 21 is a side sectional view showing a light emitting device according to the tenth embodiment. The same reference numerals will be assigned to the same elements and description about the elements and structures that have already been explained in the first and ninth embodiments will be omitted in order to avoid redundancy.

Referring to FIG. 21, the light emitting device 600A includes the electrode layer 640 and the bottom electrode 645, which are connected to each other through a connection electrode 642A in the form of a via. Both ends of the connection electrode 642A make contact with the electrode layer 640 and the bottom electrode 645. A plurality of connection electrodes 642A can be provided.

Figure 22:
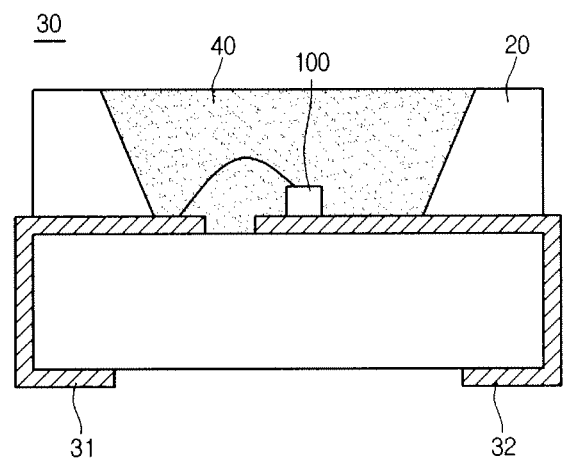
FIG. 22 is a sectional view showing a light emitting device package having a light emitting device according to the embodiment.

FIG. 22 is a sectional view showing a light emitting device package according to the embodiment.

Referring to FIG. 22, the light emitting device package 30 includes a body 20, first and second lead electrodes 31 and 32 formed on the body 20, the light emitting device 100 provided on the body 20 and electrically connected to the first and second lead electrodes 31 and 32 and a molding member 40 that surrounds the light emitting device 100.

The body 20 may be a conductive substrate including silicon, a synthetic resin substrate including PPA, a ceramic substrate, an insulating substrate, or a metal substrate such as MCPCB. An inclined surface may be formed around the light emitting device 100. The body 20 may have a through hole structure, but the embodiment is not limited thereto.

The first and second lead electrodes 31 and 32 are electrically isolated from each other to supply power to the light emitting device 100. In addition, the first and second lead electrodes 31 and 32 reflect the light emitted from the light emitting device 100 to improve the light efficiency and dissipate heat generated from the light emitting device 100 to the outside.

The light emitting device 100 can be installed on the body 20 or the first and second lead electrodes 31 and 32.

The light emitting device 100 is electrically connected to the first lead electrode through a wire and connected to the second lead electrode 32 through a die bonding scheme.

The molding member 40 surrounds the light emitting device 100 to protect the light emitting device 100. In addition, the molding member 40 may include phosphors to change the wavelength of the light emitted from the light emitting device 100. A lens is disposed on the molding member 40. The lens can make contact with the molding member 40 or not.

The light emitting device 100 can be electrically connected to the body or the bottom surface of the substrate via a through hole.

The light emitting device package is provided with at least one light emitting device disclosed in the embodiments. The embodiment may not limit the number of light emitting device installed in the light emitting device package.

Although the top-view type light emitting device package is disclosed in the embodiment, the side-view type light emitting device package can be used to improve the heat dissipation, conductivity and reflective characteristics. According to the top-view type light emitting device package or the side-view type light emitting device package, the light emitting device is packaged by using the resin layer and then the lens is formed on the resin layer, but the embodiment is not limited thereto.

<Light Unit>

Figure 23:
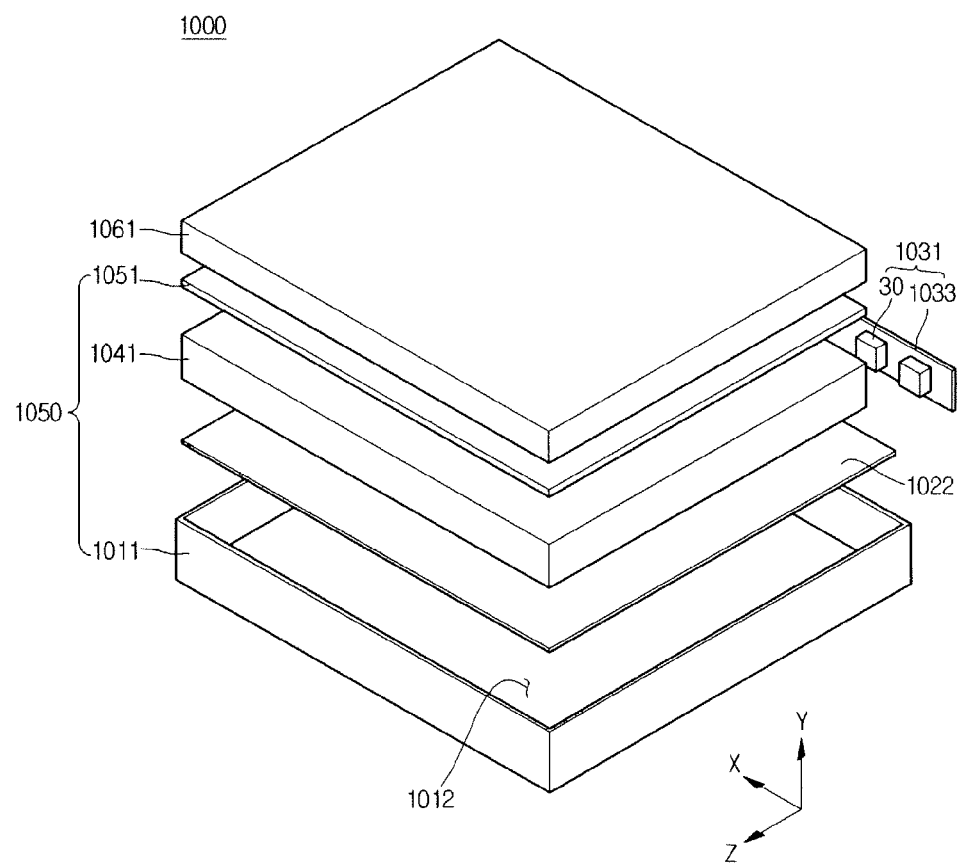
FIG. 23 is a perspective view showing a display device according to the embodiment.
Figure 24:
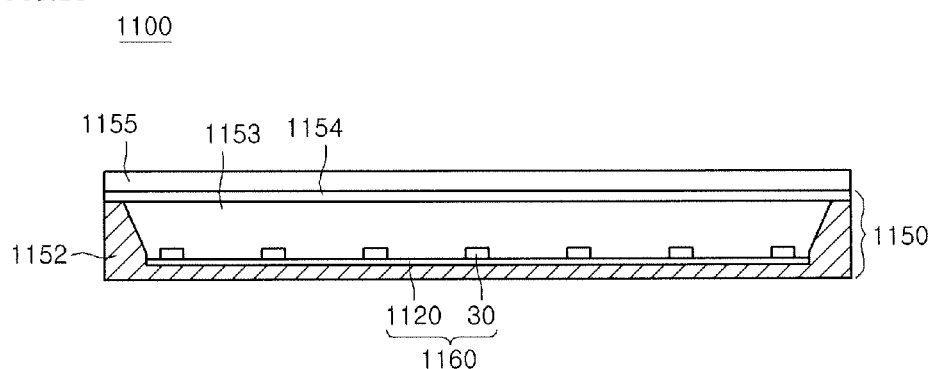
FIG. 24 is a sectional view showing a display device according to another embodiment.
Figure 25:
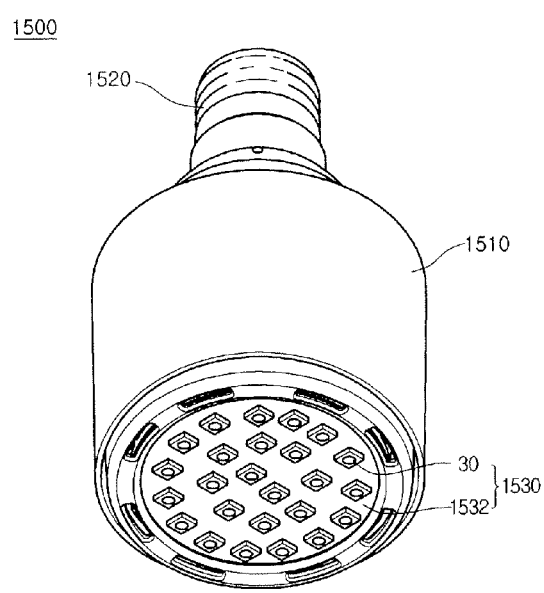
FIG. 25 is a perspective view showing an illumination device according to the embodiment.

The light emitting device or the light emitting device package according to the embodiment can be applied to the light unit. The light unit includes a plurality of light emitting devices or a plurality of light emitting device packages. The light unit may include a display device as shown in FIGS. 23 and 24 and an illumination device as shown in FIG. 25. In addition, the light unit may include an illumination lamp, a signal lamp, a headlight of a vehicle, and an electric sign board.

FIG. 23 is a perspective view showing the display device according to the embodiment.

Referring to FIG. 23, the display device 1000 according to the embodiment includes a light guide plate 1041, a light emitting module 1031 for supply the light to the light guide plate 1041, a reflective member 1022 provided under the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 supplies the light to the side of the light guide plate 1041 and serves as the light source of the display device.

At least one light emitting module 1031 is provided to directly or indirectly supply the light from the lateral side of the light guide plate 1041. The light emitting module 1031 may include a board 1033 and light emitting device packages 30 according to the embodiments. The light emitting device packages 30 are arranged on the board 1033 while being spaced apart from each other at the predetermined interval.

The board 1033 may include a printed circuit board (PCB) including a circuit pattern (not shown). In addition, the board 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the board 1033 may be omitted. The heat dissipation plate partially makes contact with the top surface of the bottom cover 1011.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed under the light guide plate 1041. The reflective member 1022 reflects the light, which is traveled downward through the bottom surface of the light guide plate 1041, toward the light guide plate 1041, thereby improving the brightness of the light unit 1050. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape, but the embodiment is not limited thereto. The bottom cover 1011 can be coupled with the top cover, but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including transparent first and second substrates, which are opposite to each other, and a liquid crystal layer interposed between the first and second substrates. A polarizing plate can be attached to at least one surface of the display panel 1061, but the embodiment is not limited thereto. The display panel 1061 displays information based on the light that has passed through the optical sheet 1051. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhancement sheet. The diffusion sheet diffuses the incident light, the horizontal and vertical prism sheet concentrates the incident light onto the display region, and the brightness enhancement sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 24 is a sectional view showing a display device according to the embodiment.

Referring to FIG. 24, the display device 1100 includes a bottom cover 1152, a board 1120 on which the light emitting device packages 30 are arranged, an optical member 1154, and a display panel 1155.

The board 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhancement sheet. The light guide plate may include PC or PMMA (Poly methyl methacrylate). The light guide plate can be omitted. The diffusion sheet diffuses the incident light, the horizontal and vertical prism sheet concentrates the incident light onto the display region, and the brightness enhancement sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 25 is a perspective view showing an illumination device according to the embodiment.

Referring to FIG. 25, the illumination device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a board 1532 and light emitting device packages 30 installed on the board 1532. The light emitting device packages 30 are spaced apart from each other or arranged in the form of a matrix.

The board 1532 includes an insulating member printed with a circuit pattern. For instance, the board 1532 includes a PCB, an MCPCB, an FPCB, a ceramic PCB, and an FR-4 board.

In addition, the board 1532 may include material that effectively reflects the light. A coating layer can be formed on the surface of the board 1532. At this time, the coating layer has a white color or a silver color to effectively reflect the light.

At least one light emitting device package 30 is installed on the board 1532. Each light emitting device package 30 may include at least one LED (light emitting diode) chip. The LED chip may include an LED that emits the light of visible ray band including red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the light emitting device packages including the light emitting device 100 are arranged on the board to form the light emitting module as shown in FIG. 20. In addition, the light emitting devices as shown in FIG. 1 are arranged on the board and then packaged to form the light emitting module.

A method of manufacturing a semiconductor light emitting device according to the embodiment includes the steps of forming a plurality of compound semiconductor layers on a substrate; forming a channel layer around upper portions of the compound semiconductor layers; forming a reflective layer on the compound semiconductor layers and the channel layer; disposing the reflective layer on a base and removing the substrate; etching channel areas of the compound semiconductor layers; forming a compound semiconductor including a concave-convex structure on the channel layer; and forming an electrode on the compound semiconductor.

As described above, the embodiment can improve the light extraction efficiency at the channel area and can improve adhesive property between the layers under the semiconductor layer. In addition, the embodiment can improve adhesive property between metal and non-metal at the channel area under the semiconductor layer. The embodiment can improve adhesive property between oxide and reflective material at the region under the semiconductor layer, thereby preventing the interlayer delamination at the channel area. The embodiment can improve reliability of the semiconductor light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
a light emitting structure including a first conductive semiconductor layer, an active layer under the first conductive semiconductor layer, and a second conductive semiconductor layer under the active layer;
a first electrode under the second conductive semiconductor layer, wherein the first electrode includes at least one contact electrode protruded from the first electrode;
a second electrode in contact with the first conductive semiconductor layer; and
an insulating member covering a surface of the first electrode and lateral sides of the at least one contact electrode, and
wherein the at least one contact electrode is contacted with the first conductive semiconductor layer through the second conductive semiconductor layer and the active layer.

2. The light emitting device as claimed in claim 1, wherein the at least one contact electrode is vertically protruded upward to make contact with an inner bottom surface of the first conductive semiconductor layer.

3. The light emitting device as claimed in claim 1, further comprising a current diffusion layer in contact with a surface of the first conductive semiconductor layer.

4. The light emitting device as claimed in claim 1, wherein an insulating member corresponding to a lateral side of the at least one contact electrode is in contact with the first conductive semiconductor layer, the active layer, and the second conductive semiconductor layer.

5. The light emitting device as claimed in claim 1, further comprising at least one of an ohmic layer and a reflective layer disposed between the first electrode and the second conductive semiconductor layer.

6. The light emitting device as claimed in claim 1, further comprising:
a support member disposed under the first electrode.

7. The light emitting device as claimed in claim 1, wherein the at least one contact electrode is in contact with the first conductive semiconductor layer through the second conductive semiconductor layer and the active layer.

8. The light emitting device as claimed in claim 7, wherein the first electrode is disposed under a bottom surface of the light emitting structure and a bottom surface of the first electrode has a width wider than that of the light emitting structure.

9. The light emitting device as claimed in claim 5, wherein the insulating member corresponding to the lateral side of the contact electrode is in contact with the ohmic layer and the reflective layer.

10. A light emitting device comprising:
a light emitting structure including a first conductive semiconductor layer, an active layer under the first conductive semiconductor layer, and a second conductive semiconductor layer under the active layer;
a first electrode under the second conductive semiconductor layer, wherein the first electrode includes at least one contact electrode protruded through the second conductive semiconductor layer and the active layer;
a second electrode in contact with a surface of the first conductive semiconductor layer;
a support member under the first electrode; and
an insulating member covering a surface of the first electrode and lateral sides of the at least one contact electrode,
wherein the first conductive semiconductor layer comprises a rough or patterned upper surface.

11. The light emitting device as claimed in claim 10, further comprising at least one of an ohmic layer and a reflective layer disposed between the first electrode and the second conductive semiconductor layer.

12. The light emitting device as claimed in claim 10, wherein the support member is formed of a metal material, wherein the support member has thickness thicker that of the first electrode.

13. The light emitting device as claimed in claim 11, wherein the insulating member is disposed between the reflective layer and the first electrode which are both disposed under the light emitting structure.

14. The light emitting device as claimed in claim 11, wherein an outer portion of the reflective layer extends outwardly beyond the bottom surface of the light emitting structure.

15. The light emitting device as claimed in claim 11, wherein an outer portion of the ohmic layer extends outwardly beyond the bottom surface of the light emitting structure.

16. The light emitting device as claimed in claim 11, wherein an outer portion of the insulating member covers a side of the ohmic layer and the reflective layer and extends outwardly from a bottom surface of the light emitting structure.

17. The light emitting device as claimed in claim 10, wherein the at least one contact electrode is contacted with the first conductive semiconductor layer through the second conductive semiconductor layer and the active layer.

18. The light emitting device as claimed in claim 10, wherein an inner portion of the insulating member is between the second electrode and the first electrode which is disposed under the light emitting structure.

19. The light emitting device as claimed in claim 10, wherein the insulating member corresponding to the lateral side of the contact electrode is in contact with the first conductive semiconductor layer, the active layer, and the second conductive semiconductor layer.

20. The light emitting device as claimed in claim 11, wherein the insulating member corresponding to the lateral side of the contact electrode is in contact with the ohmic layer and the reflective layer.

21. The light emitting device as claimed in claim 10, further comprising a current diffusion layer in contact with a surface of the first conductive semiconductor layer.

* * * * *